(12) United States Patent
Chen et al.

(10) Patent No.: US 10,746,190 B2
(45) Date of Patent: Aug. 18, 2020

(54) FAN MODULE

(71) Applicants: Inventec (Pudong) Technology Corporation, Shanghai (CN); INVENTEC CORPORATION, Taipei (TW)

(72) Inventors: Chia-Chen Chen, Taipei (TW); Chi-Zen Peng, Taipei (TW); Chia-Ju Ho, Taipei (TW); Meng-Lung Chiang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 192 days.

(21) Appl. No.: 16/019,520

(22) Filed: Jun. 26, 2018

(65) Prior Publication Data

US 2019/0107115 A1    Apr. 11, 2019

(30) Foreign Application Priority Data

Oct. 10, 2017   (CN) .......................... 2017 1 0935104

(51) Int. Cl.
| | |
|---|---|
| *F04D 29/42* | (2006.01) |
| *F04D 29/056* | (2006.01) |
| *H05K 7/20* | (2006.01) |
| *F04D 29/28* | (2006.01) |
| *F04D 29/053* | (2006.01) |

(Continued)

(52) U.S. Cl.
CPC ......... *F04D 29/056* (2013.01); *F04D 25/062* (2013.01); *F04D 29/053* (2013.01); *F04D 29/281* (2013.01); *F04D 29/4213* (2013.01); *F04D 29/4226* (2013.01); *G06F 1/20* (2013.01);

(Continued)

(58) Field of Classification Search
CPC .......................... F04D 29/4213; F04D 29/4226
See application file for complete search history.

(56) References Cited

U.S. PATENT DOCUMENTS 5,188,508 A * 2/1993 Scott ..................... F04D 29/281
 415/206
6,460,608 B1 * 10/2002 Katsui ................. F28D 15/0266
 165/80.3

(Continued)

FOREIGN PATENT DOCUMENTS

CN    103511300 A * 1/2014

OTHER PUBLICATIONS

CN103511300A Machine Translation (Year: 2012).*

*Primary Examiner* — Moshe Wilensky
*Assistant Examiner* — Brian Christopher Delrue
(74) *Attorney, Agent, or Firm* — CKC & Partners Co., LLC

(57) ABSTRACT

A fan module includes a housing, a bearing, a rotating shaft, and a fan wheel. The housing includes a bottom covering plate, a top covering plate, and a side wall connected between the bottom covering plate and the top covering plate and surrounding to form a housing space. The bearing is disposed on the bottom covering plate and includes a supporting pillar. The supporting pillar extends from the bottom covering plate toward the top covering plate. The rotating shaft has a first through hole therein. The rotating shaft is rotatably sleeved onto the supporting pillar by the first through hole. The fan wheel is connected to an outer edge of the rotating shaft.

6 Claims, 5 Drawing Sheets

(51) Int. Cl.
  *G06F 1/20* (2006.01)
  *F04D 25/06* (2006.01)
  *F04D 29/66* (2006.01)
(52) U.S. Cl.
  CPC ....... H05K 7/20172 (2013.01); F04D 29/665 (2013.01)

(56) References Cited

U.S. PATENT DOCUMENTS

| | | | | |
|---|---|---|---|---|
| 6,634,855 | B1* | 10/2003 | Rollo | F04D 29/282 415/206 |
| 7,351,031 | B2* | 4/2008 | Horng | F04D 25/0613 415/206 |
| 7,909,571 | B2* | 3/2011 | Wu | F04D 29/4213 415/206 |
| 8,508,939 | B2* | 8/2013 | Takahasi | F04D 25/08 361/679.49 |
| 9,400,000 | B2* | 7/2016 | Wang | F04D 25/0613 |
| 9,422,943 | B2* | 8/2016 | Horng | F04D 25/0613 |
| 9,719,524 | B2* | 8/2017 | Lin | F04D 29/441 |
| 10,316,860 | B2* | 6/2019 | Fujimoto | F04D 29/162 |
| 10,428,827 | B2* | 10/2019 | Yamada | F04D 29/162 |
| 2007/0009353 | A1* | 1/2007 | Huang | F04D 29/281 415/206 |
| 2007/0248459 | A1* | 10/2007 | Tseng | F04D 29/30 415/206 |
| 2008/0279682 | A1* | 11/2008 | Wydra | F04D 17/08 415/206 |
| 2010/0142146 | A1* | 6/2010 | Hwang | F04D 29/4226 361/695 |
| 2011/0058938 | A1* | 3/2011 | Chen | F04D 29/4226 415/206 |
| 2012/0114472 | A1* | 5/2012 | Horng | F04D 17/04 415/203 |
| 2012/0114511 | A1* | 5/2012 | Horng | F04D 17/04 417/410.1 |
| 2012/0121407 | A1* | 5/2012 | Yamashita | F04D 17/162 415/213.1 |
| 2013/0171014 | A1* | 7/2013 | Horng | F04D 17/04 417/423.7 |
| 2013/0243628 | A1* | 9/2013 | Zheng | F04D 17/04 417/423.7 |
| 2013/0323040 | A1* | 12/2013 | Fujita | F04D 25/0613 415/200 |
| 2014/0010681 | A1* | 1/2014 | Wang | F04D 25/0613 417/354 |
| 2014/0086762 | A1* | 3/2014 | Horng | F04D 25/0613 417/354 |
| 2014/0099197 | A1* | 4/2014 | Chen | F04D 17/162 415/206 |
| 2014/0147261 | A1* | 5/2014 | Lin | F04D 29/4226 415/191 |
| 2014/0219834 | A1* | 8/2014 | Tamaoka | F04D 17/16 417/354 |
| 2015/0043159 | A1* | 2/2015 | Tamaoka | G06F 1/203 361/679.48 |
| 2015/0159672 | A1* | 6/2015 | Lin | F04D 29/646 417/354 |
| 2015/0240835 | A1* | 8/2015 | Tsai | F04D 29/056 417/354 |
| 2016/0290358 | A1* | 10/2016 | Hayamitsu | F04D 29/441 |
| 2019/0101124 | A1* | 4/2019 | Horii | F04D 29/281 |
| 2019/0195235 | A1* | 6/2019 | Ida | F04D 29/281 |
| 2019/0230814 | A1* | 7/2019 | Hatanaka | F28D 15/0275 |
| 2020/0173460 | A1* | 6/2020 | Ueno | F04D 29/441 |

* cited by examiner

FAN MODULE

CROSS-REFERENCE TO RELATED APPLICATION

This application claims priority to Chinese Application Serial Number 201710935104.5, filed Oct. 10, 2017, which is herein incorporated by reference.

BACKGROUND

In general, in order to prevent overheating of electronic components inside a computer which leads to abnormal operation thereof, a fan is equipped on an electronic component, such as a power supply, a CPU and/or a GPU. As such, the temperature in the computer is easy to dissipate from the electronic component, so as to remove the heat generated by the electronic components during the operation. However, due to a trend of miniaturization of the internal space of the computer, a performance and a configuration of rotating components in the fan are limited, so as to hinder the dissipation of heat.

DESCRIPTION OF RELATED ART

The present invention relates to a fan module that can withstand a external force.

SUMMARY

The present disclosure provides a fan module. The fan module includes a housing, a bearing, a rotating shaft, and a fan wheel. The housing includes a bottom covering plate, a top covering plate, and a side wall connected between the bottom covering plate and the top covering plate and surrounding to form a housing space. The bearing is disposed on the bottom covering plate of the housing and includes a supporting pillar. The supporting pillar of the bearing extends from the bottom covering plate of the housing toward the top covering plate. The rotating shaft has a first through hole therein. The rotating shaft is rotatably sleeved onto the supporting pillar of the bearing by the first through hole. The fan wheel is connected to an outer edge of the rotating shaft.

In some embodiments of the present disclosure, the top covering plate of the housing has a second through hole exposing the support pillar of the bearing.

In some embodiments of the present disclosure, the supporting pillar of the bearing is located in the housing space. The supporting pillar and the second through hole are spaced apart by a distance in a direction perpendicular to the top covering plate of the housing.

In some embodiments of the present disclosure, the supporting pillar of the bearing has a first height relative to the bottom covering plate of the housing. The top covering plate of the housing has a surface facing away from the bottom covering plate. The surface of the top covering plate has a second height relative to the bottom covering plate. The second height is substantially equal to the first height.

In some embodiments of the present disclosure, the top covering plate of the housing has a central portion and a peripheral portion surrounding the central portion. The peripheral portion of the top covering plate and the bottom covering plate are spaced apart by a first distance. The central portion the top covering plate and the bottom covering plate are spaced apart by a second distance. The second through hole is formed at the central portion of the top covering plate. The second distance is greater than the first distance.

In some embodiments of the present disclosure, the supporting pillar of the bearing has a first height relative to the bottom covering plate. The rotating shaft has a second height relative to the bottom covering plate. The first height is greater than the second height.

In some embodiments of the present disclosure, the fan module further includes a surrounding bottom plate and a surrounding wall. The surrounding wall surrounds the supporting pillar of the bearing. The surrounding bottom plate is connected between the supporting pillar and the surrounding wall. The supporting pillar, the surrounding wall, and the surrounding bottom plate form a ring-shaped groove. The rotating shaft is rotatably engaged to the ring-shaped groove.

In some embodiments of the present disclosure, the surrounding bottom plate, the surrounding wall, and the bearing form a one piece structure.

In some embodiments of the present disclosure, the rotating shaft includes a sleeve portion and a ring-shaped protruding portion. The ring-shaped protruding portion is connected to an end of the sleeve portion facing away from the bottom covering plate and extends toward a direction facing away from the sleeve portion.

In some embodiments of the present disclosure, the fan wheel includes a fan hub. The fan hub surrounds and is embedded with an outer edge of the ring-shaped protruding portion.

In the aforementioned configurations, when the external force is applied to the fan module, the supporting column of the bearing is able to bear the external force to prevent the external force from exerting on the rotating shaft and the fan wheel. As such, the supporting column is able to ensure the rotating shaft and the fan wheel to be without being collided when the fan module receives the external force, thereby enabling the fan module to prevent from damage. Furthermore, since the supporting column of the embodiment is connected to the bottom covering plate, when the supporting column receives the external force, the supporting column is able to transmit the external force to the bottom covering plate. That is, in the fan module of the embodiment, the supporting column and the bottom covering plate may be able to simultaneously resist the external force to reinforce the structure of the fan module against the external force.

BRIEF DESCRIPTION OF THE DRAWINGS

The invention can be more fully understood by reading the following detailed description of the embodiment, with reference made to the accompanying drawings as follows:

FIG. 2 is in that the baffle withstands an external force;

DETAILED DESCRIPTION

Figure 1:
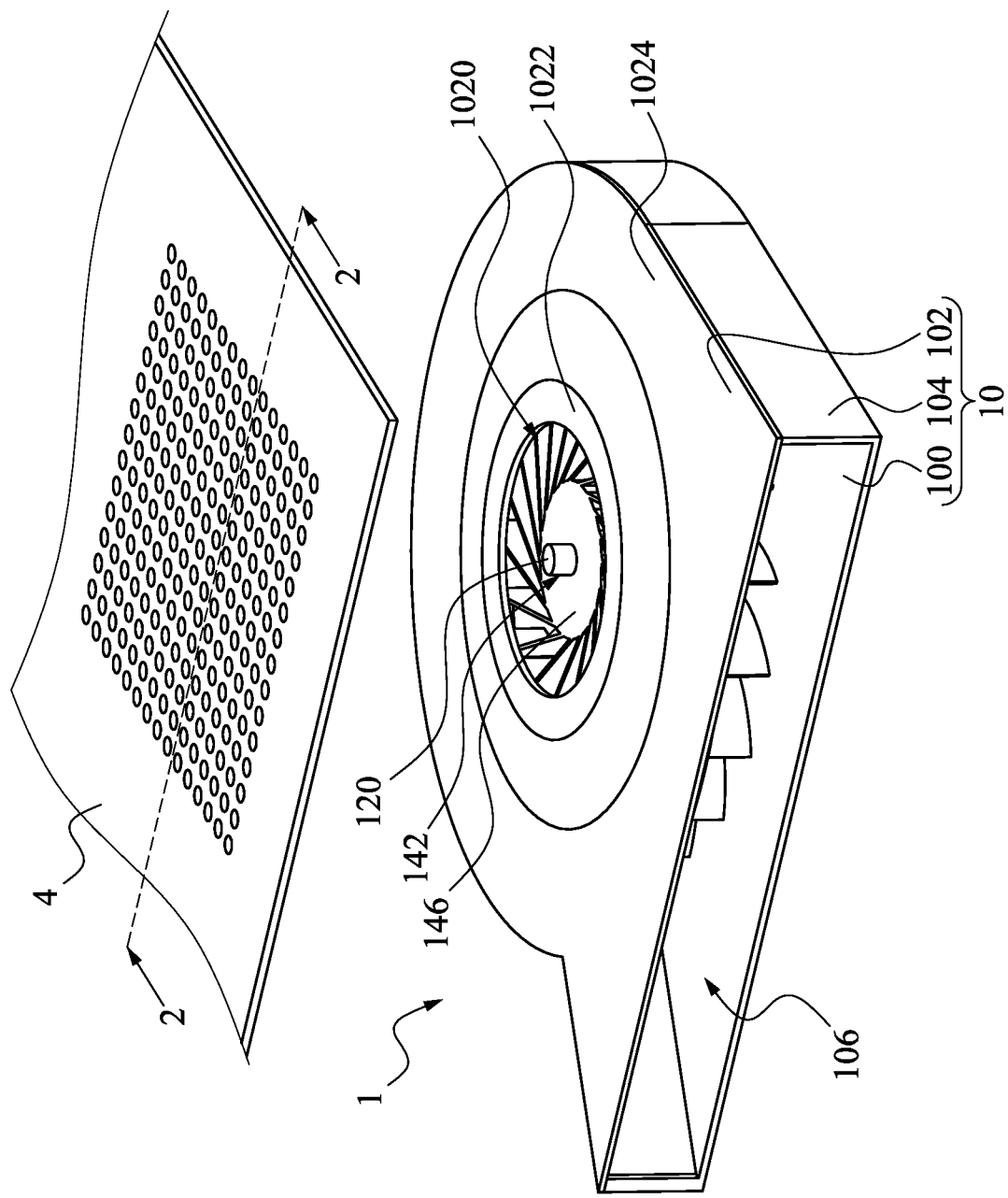
FIG. 1 is an exploded view of a fan module and a baffle in an electronic device in accordance with some other embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
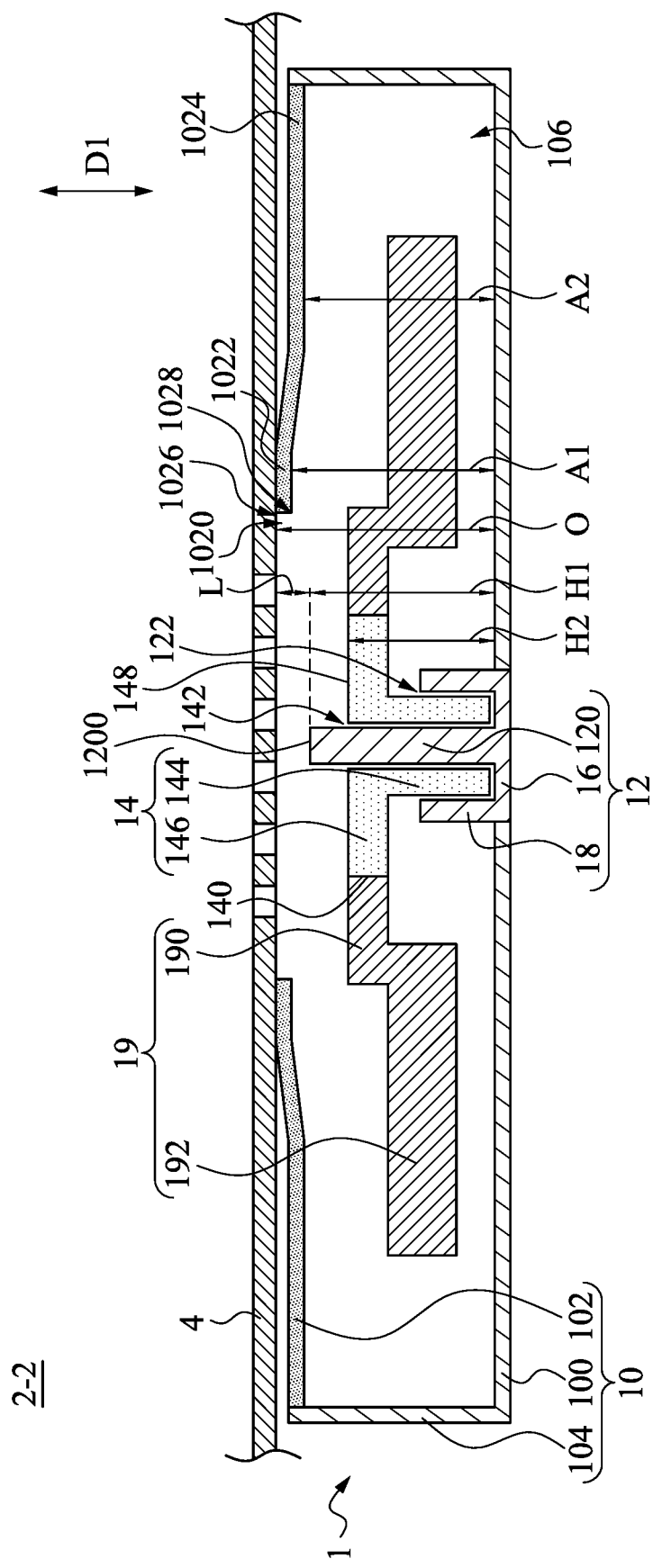
FIG. 2 is a cross-sectional view along a line 2-2 in FIG. 1.

Reference is made to FIGS. 1 and 2. FIG. 1 is an exploded view of a fan module 1 and a baffle 4 in an electronic device (not shown) in accordance with some other embodiments of the present disclosure. FIG. 2 is a cross-sectional view along a line 2-2 in FIG. 1. As shown in FIGS. 1 and 2, in the embodiment, the fan module 1 includes a housing 10, a bearing 12 (as shown in FIG. 2), a rotating shaft 14, and a fan wheel 19. In the embodiment, the electronic device can be a host computer, a mobile device, or any other suitable device. The structure and function of the elements and the relationship therebetween are described in detail hereinafter.

As shown in FIG. 2, the housing 10 of the fan module 1 includes a bottom covering plate 100, a top covering plate 102, and a side wall 104. The side wall is connected between the bottom covering plate 100 and the top covering plate 102 and surrounds to form a housing space 106. In the embodiment, a direction D1 is defines as a direction orthogonal to the bottom covering plate 100 of the housing 10. The top covering plate 102 of the housing 10 has a central portion 1022, a peripheral portion 1024 surrounding the central portion 1022, and a through hole 1020. The through 1020 of the top covering plate 102 is opened at the central portion 1022 and has a first opening 1026 and a second opening 1028 opposite to the first opening 1026 therein. The first opening 1026 is located at a side of the top covering plate 102 facing away from the bottom covering plate 100, and the second opening 1028 is located at a side of the top covering plate 102 adjacent to the bottom covering plate 100. The first opening 1026 of the through hole 102 and the bottom covering plate 100 are spaced apart by a distance O. The central portion 1022 of the top covering plate 102 and the bottom covering plate 100 are spaced apart by a first distance A1. The peripheral portion 1024 of the top covering plate 102 and the bottom covering plate 100 are spaced apart by a first distance A2. The first distance A1 is greater than the second distance A2. The baffle 4 in the electronic device covers the through 1020 of the top covering plate 102.

As shown in FIG. 2, the bearing 12 is disposed on the bottom covering plate 100 and includes a supporting pillar 120, a surrounding bottom plate 16, and a surrounding wall 18. The supporting pillar 120 of the bearing 12 is located in the housing space 106 and extends from the bottom covering plate 100 of the housing 10 toward the top covering plate 102. The supporting pillar 120 has a top surface 1200 opposite to the bottom covering plate 100. Specifically, the top surface 1200 of the supporting pillar 120 and the first opening 1026 of the through hole 1020 are spaced apart by a distance L in the direction D1, and the top surface 1200 of the supporting pillar 120 has a first height H1 relative to the bottom covering plate 100 of the housing 10.

In the embodiment, the surrounding wall 18 of the bearing 12 surrounds the supporting pillar 120. The surrounding bottom plate 16 is connected between the supporting pillar 120 of the bearing 12 and the surrounding wall 18. The supporting pillar 120 of the bearing 12, the surrounding wall 18, and the surrounding bottom plate 16 form a ring-shaped groove 122. An opening of the ring-shaped groove 122 faces toward the top covering plate 102.

As shown in FIG. 2, the rotating shaft 14 of the fan module 1 includes a ring-shaped protruding portion 146 and a sleeve portion 144. The ring-shaped protruding portion 146 of the rotating shaft 14 is connected to an end of the sleeve portion 144 facing away from the bottom covering plate 100 of the housing 10, and extends away from the sleeve portion 144. The sleeve portion 144 of the rotating shaft 14 has a through hole 142. The sleeve portion 144 of the rotating shaft 14 is rotatably sleeved onto the supporting pillar 120 of the bearing 12 by the through hole 142 therein and rotatably engages the ring-shaped groove 122. The rotating shaft 14 has a top surface 148 opposite to the bottom covering plate 100. The top surface 148 of the rotating shaft 14 has a second height H2 relative to the bottom covering plate 100 of the house 10. In the embodiment, the first height H1 of the supporting pillar 120 of the bearing 12 is greater than the second height H2 of the rotating shaft 14.

In the embodiment, the fan wheel 19 of the fan module 1 includes a fan hub 190 and fan leaves 192. The fan hub 190 of the fan wheel 19 surrounds and is embedded in an outer edge 140 of the ring-shaped protruding portion 146 of the rotating shaft 14. The fan leaves 192 of the fan wheel 19 are connected to an outer edge of the fan hub 190.

Figure 3:
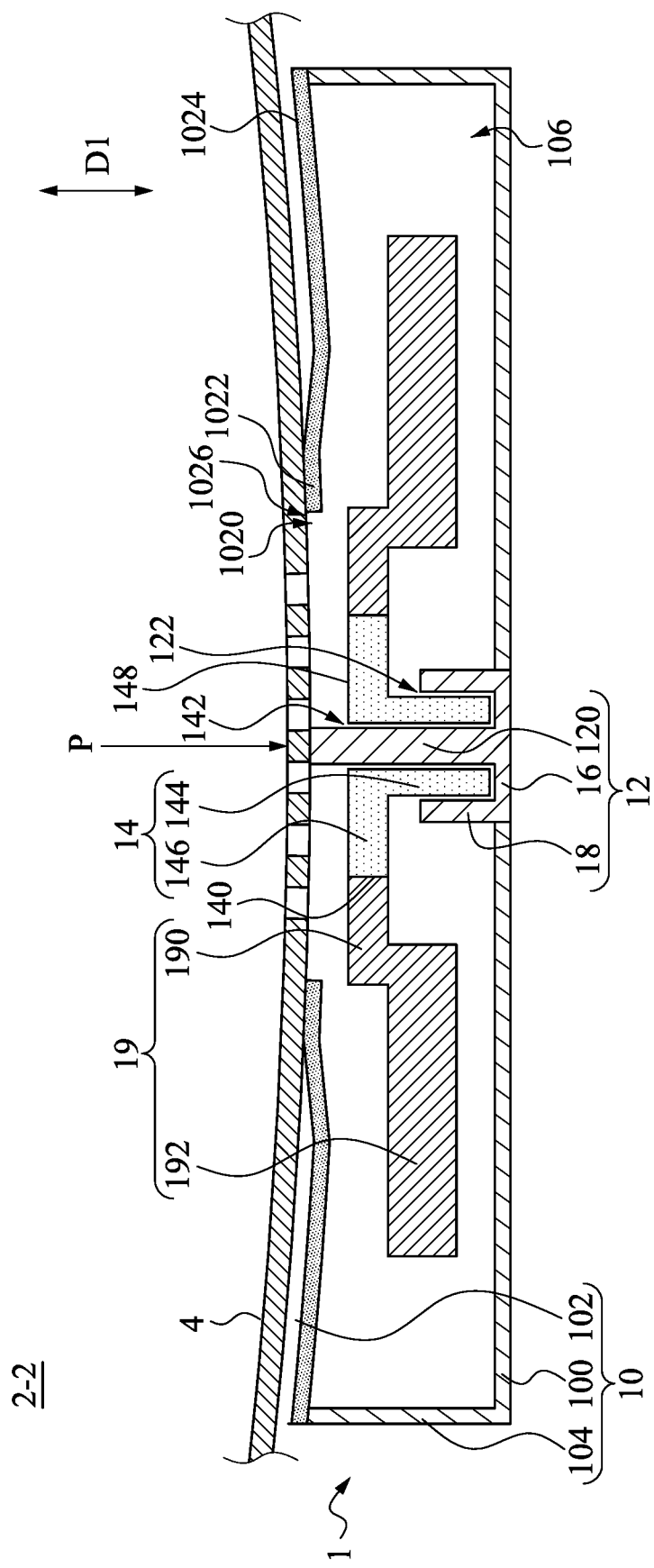
FIG. 3 is another cross-sectional view along the line 2-2 in FIG. 1, in which the difference between the FIG. 3

Reference is made to FIGS. 2 and 3. The FIG. 3 is another cross-sectional view along the line 2-2 in FIG. 1, in which the difference between the FIG. 3 and FIG. 2 is in that the baffle 4 withstands an external force P. In the embodiment, when the external force P is applied to the fan module 1 and the baffle 4, the baffle 4 bends and deforms toward an inside of the fan module 1 under the external force P. In other words, the baffle 4 receives the external force P and gradually approaches the bearing 12, the rotating shaft 14, and the fan wheel 19. Since the first height H1 of the supporting column 120 is greater than the second height H2 of the rotating shaft 14, when the baffle 4 receives the external force P and gradually approaches the bearing 12, the baffle 4 is able to pass through the through hole 1020 of the top covering plate 102 to contact with the supporting column 120 without being in contact with the rotating shaft 14. As such, the supporting column 120 is able to ensure the rotating shaft 14 and the fan wheel 19 do not collide when the fan module 1 receives the external force P, thereby enabling the fan module 1 to prevent from damage.

In the embodiment, since the supporting column 120 is connected to the bottom covering plate 100, when the supporting column 120 receives the external force P, the supporting column 120 is able to transmit the external force P to the bottom covering plate 100. That is, in the fan module 1 of the embodiment, the supporting column 120 and the bottom covering plate 100 may be able to simultaneously resist the external force P to reinforce the structure of the fan module 1 against the external force P.

Furthermore, since the first distance A1 between the central portion 1022 of the top covering plate 102 and the bottom covering plate 100 is greater than the second distance A2 between the peripheral portion 1024 and the bottom covering plate 100, when the supporting column 120 receives the external force P, the fan module 1 of the embodiment is able to resist the external force P through the central portion 1022 of the top covering plate 102. When the central portion 1022 of the top covering plate 102 receives the external force P and gradually approaches to contact the supporting column 120, the supporting column 120 and the central portion 1022 of the top covering plate 102 are able to resist the external force P simultaneously to prevent the external force P from being applied on the rotating shaft 14 and the fan wheel 19 to damage the fan module 1.

Figure 4:
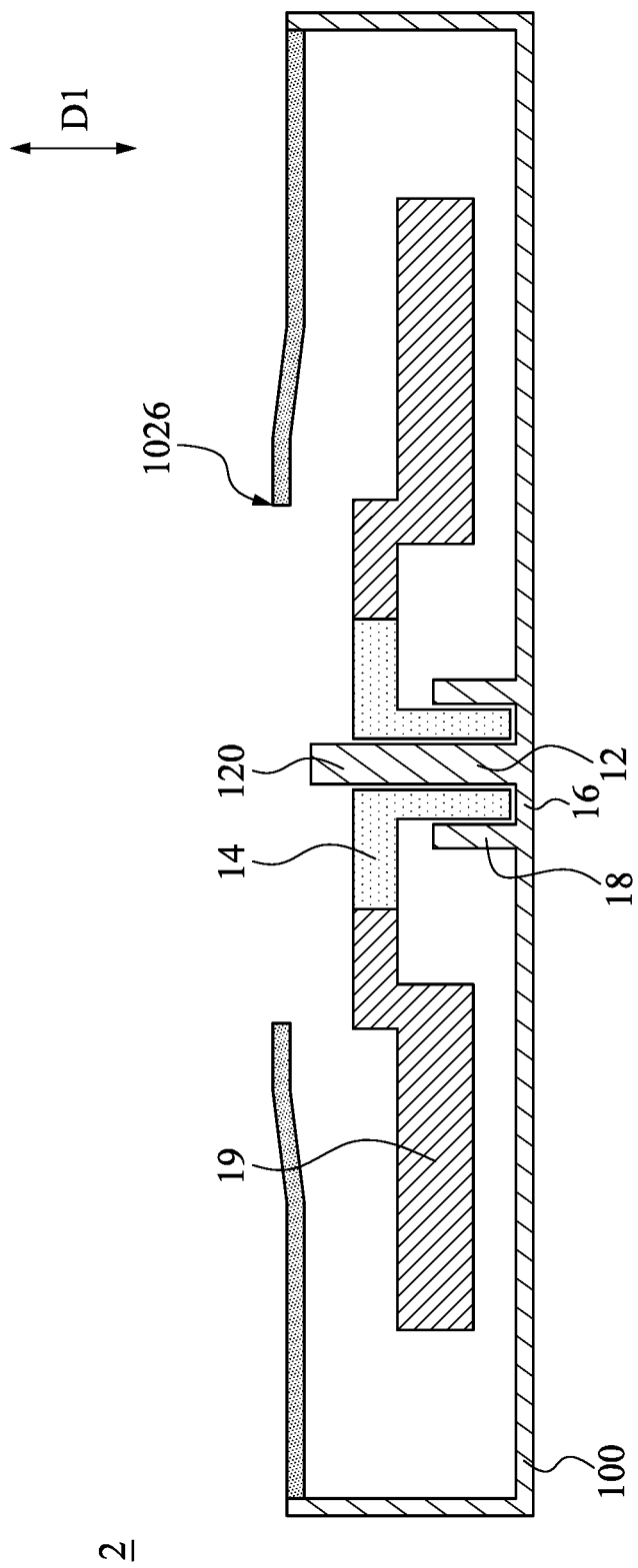
FIG. 4 is a cross-sectional view of another fan module in accordance with some other embodiments of the present disclosure.

Reference is made to FIG. 4. FIG. 4 is a cross-sectional view of another fan module 2 in accordance with some other embodiments of the present disclosure. As shown in FIG. 4, the fan module 2 includes the housing 10, the bearing 12, the surrounding bottom plate 16, surrounding wall 18, the rotating shaft 14, and the fan wheel 19. The structure and function of the components and their relationships are substantially the same as the fan module 1 shown in FIGS. 1 to 3, and the related detailed descriptions may refer to the foregoing paragraphs, and are not described again herein. It is noted that, the difference between the present embodiment and the embodiment in FIGS. 1 to 3 is in that the surrounding bottom plate 16, surrounding wall 18, and the bearing 12 form a one piece structure. As such, when the supporting column 120 receives the external force P (see FIG. 3), the supporting column 120 is able to transmit the external force P to the surrounding bottom plate 16, surrounding wall 18, and the bottom covering plate 100 to reinforce the structure of the fan module 2 against the external force P.

Figure 5:
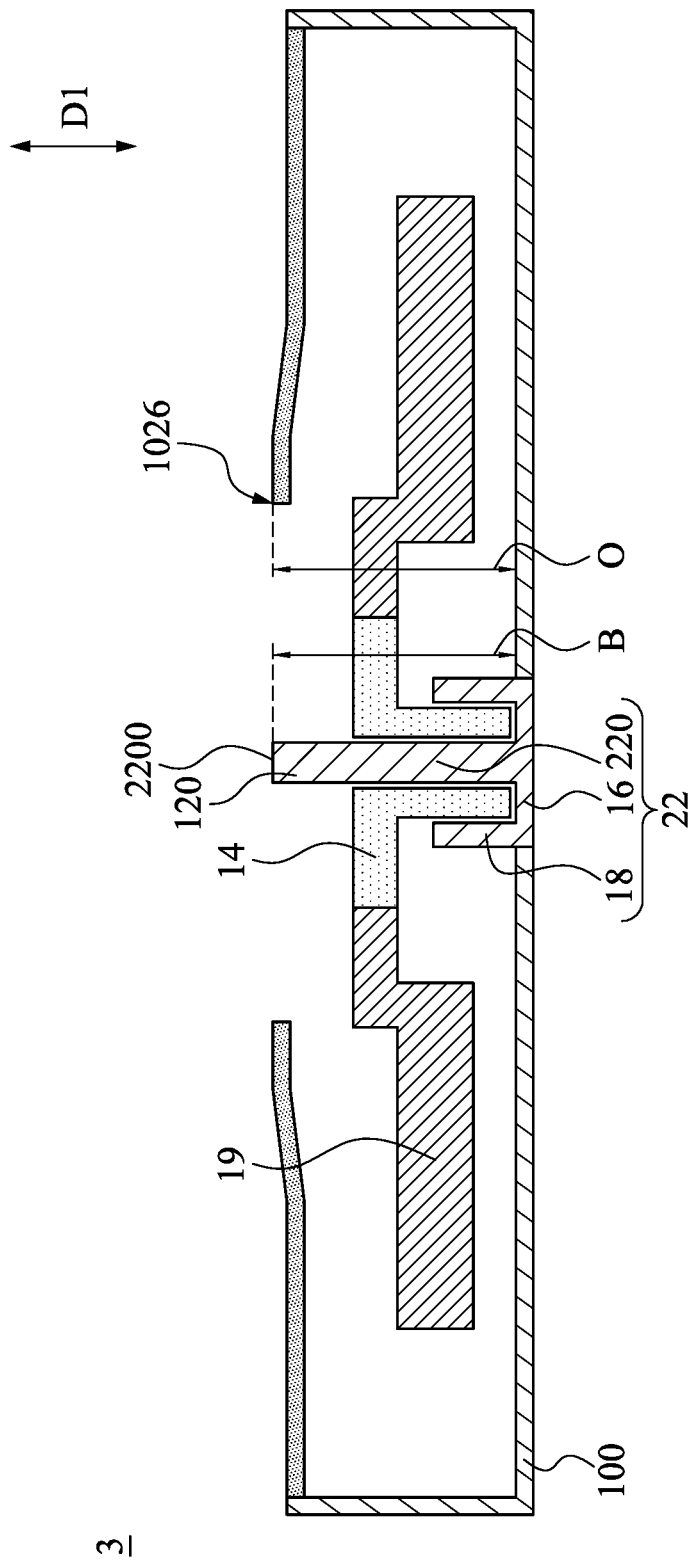
FIG. 5 is a cross-sectional view of another fan module in accordance with some other embodiments of the present disclosure.

Reference is made to FIG. 5. FIG. 5 is a cross-sectional view of another fan module 3 in accordance with some other embodiments of the present disclosure. As shown in FIG. 5, the fan module 3 of the embodiment includes the housing 10, a bearing 22, the surrounding bottom plate 16, the surrounding wall 18, the rotating shaft 14, and the fan wheel 19. The structure and function of the components and their relationships are substantially the same as the fan module 1 shown in FIGS. 1 to 3, and the related detailed descriptions may refer to the foregoing paragraphs, and are not described again herein. It is noted that, the difference between the present embodiment and the embodiment in FIGS. 1 to 3 is in that a top surface 220 of the supporting column 220 of the bearing 22 and the bottom covering plate 100 of the housing 10 are spaced apart by a distance B in the direction D1. The distance B is substantially the same as a distance O by which the first opening 1026 of the through hole 1020 and the bottom covering plate are spaced apart.

As such, when the fan module 3 receives the external force P (see FIG. 3), the supporting column 220 and the top covering plate 102 are able to contact the baffle 4 simultaneously against the external force P to completely transmit the external force P to the entire housing 10 of the fan module 3, so as to reinforce the structure of the fan module 3 against the external force P.

According to the foregoing embodiments of the disclosure, it can be seen that, when the external force is applied to the fan module, the supporting column of the bearing is able to bear the external force to prevent the external force from exerting on the rotating shaft and the fan wheel. As such, the supporting column is able to ensure the rotating shaft and the fan wheel to be without being collided when the fan module receives the external force, thereby enabling the fan module to prevent from damage. Furthermore, since the supporting column of the embodiment is connected to the bottom covering plate, when the supporting column receives the external force, the supporting column is able to transmit the external force to the bottom covering plate. That is, in the fan module of the embodiment, the supporting column and the bottom covering plate may be able to simultaneously resist the external force to reinforce the structure of the fan module against the external force.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A fan module, comprising:
 a housing comprising:
  a bottom covering plate;
  a top covering plate comprising a central portion and a peripheral portion surrounding the central portion; and
  a side wall connected between the bottom covering plate and the top covering plate and surrounding to form a housing space;
 a bearing disposed on the bottom covering plate and comprising a supporting pillar that extends from the bottom covering plate toward the top covering plate and located in the housing space,
 wherein the central portion of the top covering plate has a first through hole formed in a topmost portion thereof to expose the support pillar directly below the first though hole, the peripheral portion of the top covering plate and the bottom covering plate are spaced apart by a first distance, the central portion of the top covering plate and the bottom covering plate are space apart by a second distance that is greater than the first distance, and the supporting pillar and the first through hole of the top covering plate are spaced apart by a distance in a direction perpendicular to the top covering plate;
 a rotating shaft having a second through hole therein, wherein the rotating shaft is rotatably sleeved onto the supporting pillar by the second through hole; and
 a fan wheel connected to an outer edge of the rotating shaft.

2. The fan module of claim 1, wherein the supporting pillar of the bearing has a first height relative to the bottom covering plate, the rotating shaft has a second height relative to the bottom covering plate, and the first height is greater than the second height.

3. The fan module of claim 1, further comprising a surrounding bottom plate and a surrounding wall, wherein the surrounding wall surrounds the supporting pillar of the bearing, the surrounding bottom plate is connected between the supporting pillar and the surrounding wall, the supporting pillar, the surrounding wall, and the surrounding bottom plate form a ring-shaped groove, and the rotating shaft is rotatably engaged to the ring-shaped groove.

4. The fan module of claim 3, wherein the surrounding bottom plate, the surrounding wall, and the bearing form a one piece structure.

5. The fan module of claim 1, wherein the rotating shaft comprises a sleeve portion and a ring-shaped protruding portion, the ring-shaped protruding portion is connected to an end of the sleeve portion facing away from the bottom covering plate and extends toward a direction facing away from the sleeve portion.

6. The fan module of claim 5, wherein the fan wheel comprises a fan hub, and the fan hub surrounds and is embedded with an outer edge of the ring-shaped protruding portion.

\* \* \* \* \*